United States Patent
Jo et al.

(10) Patent No.: US 9,613,987 B2
(45) Date of Patent: Apr. 4, 2017

(54) DISPLAY DEVICE

(71) Applicant: LG Display Co., Ltd., Seoul (KR)

(72) Inventors: Young Jik Jo, Paju-si (KR); Young Sik Jeong, Paju-si (KR); So Young Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/568,197

(22) Filed: Dec. 12, 2014

(65) Prior Publication Data

US 2015/0187806 A1    Jul. 2, 2015

(30) Foreign Application Priority Data

Dec. 31, 2013 (KR) .................. 10-2013-0169297

(51) Int. Cl.
| | |
|---|---|
| *H01L 21/58* | (2006.01) |
| *H01L 21/336* | (2006.01) |
| *H01L 27/12* | (2006.01) |
| *H01L 27/32* | (2006.01) |
| *G02F 1/1343* | (2006.01) |
| *G02F 1/1362* | (2006.01) |

(52) U.S. Cl.
CPC ...... *H01L 27/124* (2013.01); *G02F 1/134363* (2013.01); *G02F 1/136209* (2013.01); *H01L 27/3297* (2013.01); *G02F 2001/136222* (2013.01)

(58) Field of Classification Search
CPC .................. H01L 51/5243; H01L 27/3276
USPC .................. 257/72, 59, 40, 98, 355
See application file for complete search history.

(56) References Cited

U.S. PATENT DOCUMENTS

| | | | | |
|---|---|---|---|---|
| 2002/0180900 | A1* | 12/2002 | Chae | G02F 1/13458 349/43 |
| 2003/0020852 | A1* | 1/2003 | Chang | G02F 1/136209 349/110 |
| 2003/0112398 | A1* | 6/2003 | Kim | G02F 1/134309 349/129 |
| 2004/0211964 | A1* | 10/2004 | Sakakura | H01L 27/3276 257/72 |
| 2006/0097256 | A1* | 5/2006 | Yamazaki | H01L 27/3244 257/59 |
| 2007/0024774 | A1* | 2/2007 | Cho | G02F 1/133516 349/106 |
| 2008/0117344 | A1* | 5/2008 | Kim | H01L 27/1248 349/39 |

(Continued)

FOREIGN PATENT DOCUMENTS

| | | |
|---|---|---|
| CN | 103163696 A | 6/2013 |
| CN | 1467555 A | 1/2014 |

(Continued)

*Primary Examiner* — Long K Tran
*Assistant Examiner* — Thai T Vuong
(74) *Attorney, Agent, or Firm* — Birch, Stewart, Kolasch & Birch, LLP

(57) ABSTRACT

A display device including a data line disposed on a substrate; a first pigment layer formed to cover the data line; a second pigment layer disposed by a side of the first pigment layer and formed to have a first region which corresponds to an overlap region of the first and second pigment layers; and common electrodes arranged on second regions in which the first and second pigment layers do not overlap with each other.

17 Claims, 2 Drawing Sheets

(56) References Cited

U.S. PATENT DOCUMENTS

| | | | |
|---|---|---|---|
| 2009/0284825 A1* | 11/2009 | Kim | G02F 1/167 359/296 |
| 2009/0315035 A1* | 12/2009 | Yeh | G02F 1/136259 257/71 |
| 2011/0128253 A1* | 6/2011 | Yoon | G02F 1/13338 345/174 |
| 2011/0159769 A1* | 6/2011 | Kim | G02F 1/133512 445/24 |
| 2012/0105777 A1* | 5/2012 | Lee | H01L 27/124 349/106 |
| 2012/0138904 A1* | 6/2012 | Shimizu | H01L 51/0004 257/40 |

FOREIGN PATENT DOCUMENTS

| | | |
|---|---|---|
| JP | 2013-210650 A | 10/2013 |
| TW | I408449 B1 | 9/2013 |

\* cited by examiner

DISPLAY DEVICE

The present application claims priority under 35 U.S.C. §119(a) to Korean Patent Application No. 10-2013-0169297 filed on Dec. 31, 2013 which is hereby incorporated by reference in its entirety.

BACKGROUND

Field of the Invention

The present application relates to a display device. More particularly, the present application relates to a display device adapted to prevent the load increment of a high definition panel.

Description of the Related Art

Flat panel display devices which can be used instead of cathode ray tubes (CRTs) include liquid crystal display (LCD) devices, plasma display panels (PDPs), and organic light emitting display (OLED) devices. Flat panel display devices have many benefits including being a large size, being slim, and having low power consumption.

Flat panel display devices having high definition according to the related art can have a data double feeding mode or a divisional driving mode to solve load increment problems of the panels. However, such flat panel display devices of the related art still have load increment and cost increment problems due to their structural factors. In accordance therewith, faults are generated in the flat panel display devices of the related art.

BRIEF SUMMARY

Accordingly, embodiments of the present application are directed to a display device that substantially obviates one or more of problems due to the limitations and disadvantages of the related art.

The embodiments are to provide a display device which is adapted to prevent the load increment of a data line at the realization of a high definition panel.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

A display device disclosed herein includes a data line disposed on a substrate; a first pigment layer formed to cover the data line; a second pigment layer disposed by a side of the first pigment layer and formed to have a first region which corresponds to an overlap region of the first and second pigment layers; and common electrodes arranged on second regions in which the first and second pigment layers does not overlap with each other.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation, on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiments of the present disclosure and together with the description serve to explain the disclosure. In the drawings.

DETAILED DESCRIPTION OF THE EMBODIMENTS

Figure 1:
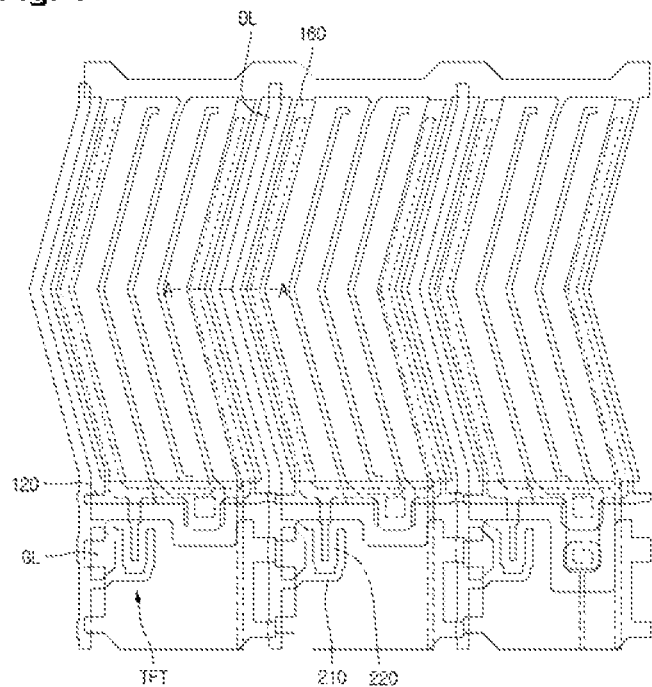
FIG. 1 is a planar view illustrating pixels of a display device according to a first embodiment of the present invention.

Reference will now be made in detail to embodiments of the present disclosure, examples of which are illustrated in the accompanying drawings. These embodiments introduced hereinafter are provided as examples to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

Figure 2:
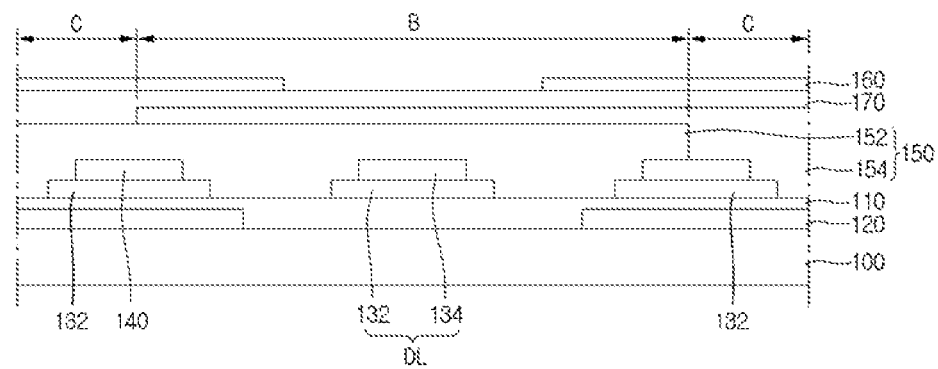
FIG. 2 is a cross-sectional view illustrating a pixel structure of the display device taken a line A-A' in FIG. 1.

FIGS. 1 and 2 illustrate a display device according to a first embodiment of the present disclosure. The display device can include a gate line GL and a data line DL which are disposed on a transparent base substrate 100 to cross each other.

The gate line GL and the data line DL crossing each other can define a pixel region. A first insulation layer 110 is interposed between the gate line GL and the data line DI and used to electrically insulate the gate line GL and the data line DL from each other. A thin film transistor TFT used as a switching element can be disposed at an intersection of the gate line GL and the data line DL.

A common voltage supply line 120 can be disposed on a region of the substrate 100 adjacent to the gate line GL. In detail, the common voltage supply line 120 can be formed on a parallel region with the gate line GL and another parallel region with the data line DL.

Also, the common voltage supply line 120 can be disposed in edges of the pixel region which is defined by the gate line GL and the data line DL. The common voltage supply line 120 can be disposed parallel to the data line DL in such a manner as to be separate from the data line DL. In other words, the common voltage supply line 120 does not overlap the data line DL.

The thin film transistor TFT can include a gate electrode with a wider width than that of the gate line GL; a semiconductor pattern formed on a gate insulation layer 112 opposite to the gate electrode; and source and drain electrodes 210 and 220 disposed on the semiconductor pattern. The source electrode 210 and the drain electrode 220 are separated from each other by a channel region of the pattern therebetween. The gate electrode can be formed in a single body united with the gate line GL. The drain electrode 220 can be electrically connected to a pixel electrode through a contact hole. The common voltage supply line 120 can be electrically connected to a common electrode through another contact hole.

The data line DL can include the semiconductor pattern 132 and a metal pattern 134 disposed on the semiconductor pattern 132. The pixel electrodes 140 can be arranged by both sides of the data line DL.

Pigment layers can be disposed over the data line DL. The pigment layers 150 can be disposed to expand from the data line DL in a side direction of the data line DL and the other side direction of the data line DL. The pigment layers 150 can includes a first pigment layer 152 and a second pigment layer 154. The first pigment layer can become a red pigment layer. The second pigment layer 154 can be disposed by a side of the first pigment layer 152. Also, the second pigment layer 154 can become a green pigment layer. In other words, the first pigment layer 152 and the second pigment layer 154 can be disposed on both side regions based on the data line DL. Alternatively, the first pigment layer 152 can become one of red, green and blue pigment layers, and the second pigment layer 154 can become one of the other pigment layers.

More specifically, each of the first and second pigment layers can be defined into first and second regions B and C. The first region 13 can be defined as an overlap region of the first and second pigment layers 152 and 154, and the second region can be defined as a non-overlap region of the first and second pigment layer 152 and 154. In the first region B, the second pigment layer 154 can be disposed on the first pigment layer 152. The data line DL can be disposed on the first region B in such a manner as to be covered with the first and second pigment layers 152 and 154. As such, the first region B corresponding to the overlap region of the first and second pigment layers 152 and 154 can be a non-transmission region intercepting light. In other words, light cannot penetrate through the first region B in which the first and second pigment layers 152 and 154 overlap with each other.

The common electrodes 160 can be formed on the pigment layers 150. The common electrode 160 can be disposed in such a manner as to overlap with a part of the data line DL and a part of the common voltage supply line 120. The common electrode 160 can further include second common electrodes of a bar shape which are branched from the first common electrode 160.

The common electrodes 160 can be disposed over the pigment layers 150 in such a manner as to be separate from the pigment layers 150. To this end, a second insulation layer can be interposed between the common electrodes 160 and the pigment layers 150. Also, the common electrodes 160 can be disposed only on the second region C of the second insulation layer 170 in which the pigment layers 150 does not overlap with each other. Moreover, the common electrodes 160 can be disposed in such a manner as to expand up to the first region B in which the pigment layers 150 overlap with each other. However, the common electrodes 160 cannot overlap with the data line DL. In other words, the common electrodes 160 can be disposed in such a manner as to be separate from both edges of the data line DL.

In this manner, the common electrodes 160 are not disposed over the data line DL. As such, a load being applied to the data line DL can be reduced. The display device according to a first embodiment of the present disclosure can reduce the load of the data line DL below ½, compared to that of the related art which allows the common electrodes 160 to be disposed over the data line DL.

Figure 3:
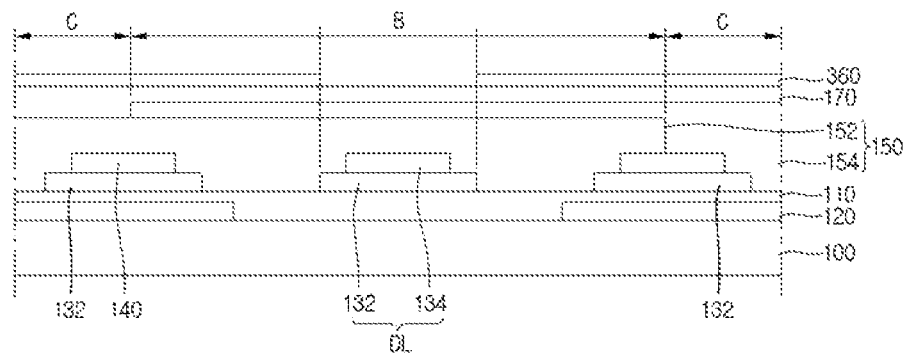
FIG. 3 is a cross-sectional view illustrating a pixel of a display device according to a second embodiment of the present invention.

Next, FIG. 3 is a cross-sectional view illustrating a pixel of a display device according to a second embodiment of the present disclosure. Referring to FIG. 3, a display device according to a second embodiment of the present disclosure can include: a data line DL disposed on a substrate 100; a first pigment layer 152 disposed to cover the data line DL; a second pigment layer 154 disposed by a side of the first pigment layer 152 and configured to have a region B overlapping with the first pigment layer 152; and common electrodes 360 arranged over the first and second pigment layers 152 and 154 in such a manner as to be separate from each other. Such a display device of the second embodiment has a similar configuration as that of the first embodiment of FIG. 2, with the exception of the common electrodes.

The common electrodes 360 can be disposed in such a manner as to overlap with a part of the data line DL and a part of the common voltage supply line 120. Also, the common electrodes 360 can be arranged over the pigment layers 150 in such a manner as to be separate from each other. Moreover, the common electrodes 360 can be disposed each opposite to second regions C. Alternatively, the common electrodes 360 can be formed in such a manner as to expand up to a part of the first region B which corresponding to the overlap region of the first and second pigment layers 152 and 154. In detail, the common electrodes 360 can be arranged regions not overlapping with the data line DL.

Edges of the common electrodes 360 can be disposed at perpendicular lines extending from edges of the data line DL. In detail, one edge of a common electrode 360 disposed by a side of the data line DL corresponds to a perpendicular line extending from one edge of the data line DL. Also, one edge of another common electrode 360 disposed by the other edge of the data line DL corresponds to another perpendicular line extending from the other edge of the data line DL. Alternatively, one of edges of the common electrodes arranged by both sides of the data line DL can correspond to one of both perpendicular lines extending to both edge of the data line DL.

In this way, the common electrodes 360 are not disposed over the data line DL. As such, a load being applied to the data line DL can be reduced. The display device according to a second embodiment of the present disclosure can reduce the load of the data line DL below ½, compared to that of the related art which allows the common electrodes 360 to be disposed over the data line DL.

Figure 4:
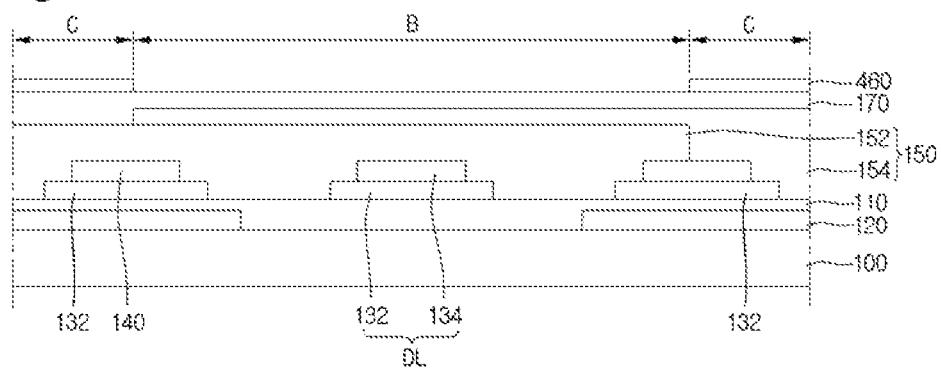
FIG. 4 is a cross-sectional view illustrating a pixel of a display device according to a third embodiment of the present invention.

Next, FIG. 4 is a cross-sectional view illustrating a pixel of a display device according to a third embodiment of the present disclosure. The display device according to a third embodiment can include a data line DL disposed on a substrate 100; a first pigment layer 152 disposed to cover the data line DL; a second pigment layer 154 disposed by a side of the first pigment layer 152 and configured to have a region B overlapping with the first pigment 152; and common electrodes 460 arranged over the first and second pigment layers 152 and 154 in such a manner as to be separate from each other. The display device of the third embodiment has a similar configuration as that of the first embodiment of FIG. 2, with the exception of the common electrodes.

Each of the common electrodes 460 can be disposed in such a manner as to overlap with a part of the data line DL and a part of the common voltage supply line 120. Also, the common electrodes 460 can be arranged over the pigment layers 150 in such a manner as to be separate from each other. Moreover, the common electrodes 460 can be disposed opposite to second regions C of the pigment layers 150. In other words, the common electrodes 460 can be arranged regions not overlapping with the data line DL. In detail, the common electrodes 460 can be arranged in such a manner as to be separate from one edge and the other edge of the data line DL. In this case, each of the common electrodes 460 can be disposed in such a manner as to overlap with only a part of the common voltage supply line 120.

In this way, the common electrodes 460 are not disposed over the data line DL. As such, a load being applied to the data line DL can be reduced. The display device according to a third embodiment of the present disclosure can reduce the load of the data line DL below ½, compared to that of the related art which allows the common electrodes to be disposed over the data line DL.

Although the common electrodes can be formed on the second insulation layer opposite to the pigment layers, the embodiments of the present disclosure are not limited to this. In other words, pixel electrodes instead of the common electrodes can be formed on the second insulation layer opposite to the pigment layers. The pixel electrodes can be formed similarly to the common electrodes (refer to FIGS. 2-4), and the common voltage supply line 120 disposed by both side of the data line DL can be replaced with drain electrodes of thin film transistors. The pixel electrode can overlap at least a part of the drain electrode of the thin film transistor.

Although the present disclosure has been explained according to the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents without being limited to the detailed description.

What is claimed is:

1. A display device comprising:
   a data line disposed on a substrate;
   a first pigment layer formed to cover the data line;
   a second pigment layer disposed by a side of the first pigment layer and formed to have a first region which corresponds to an overlap region of the first and second pigment layers; and
   a first common electrode and a second common electrode arranged in second regions in which the first and second pigment layers do not overlap with each other, the first common electrode is separate from the second common electrode,
   wherein the overlap region is configured to block light and includes overlapping the first pigment layer, the second pigment layer, and the data line in the first region between the first common electrode and the second common electrode, and
   wherein the data line does not overlap with the first common electrode and the second common electrode.

2. The display device of claim 1, wherein the first common electrode and the second common electrode are arranged to be on both sides of the data line.

3. The display device of claim 2, wherein at least one of the first common electrode and the second common electrode expands up to the first region.

4. The display device of claim 3, wherein only one of the first common electrode and the second common electrode arranged to be on one of both sides of the data line expands up to the first region.

5. The display device of claim 3, wherein both the first common electrode and the second common electrode arranged to be on one edge and the other edge of the data line expand up to the first region.

6. The display device of claim 3, wherein edges of the first common electrode and the second common electrode and edges of the data lines are disposed at same perpendicular lines projected from the common electrodes to the data lines, respectively.

7. The display device of claim 1, further comprising:
   a transparent base substrate;
   common voltage supply lines arranged on the transparent base substrate; and
   a first insulation layer arranged on the transparent base substrate and the common voltage supply lines, and under the data line,
   wherein the first common electrode and the second common electrode partially overlap the common voltage supply lines.

8. The display device of claim 1, further comprising an insulation layer interposed between the first and second pigment layers and the first common electrode and the second common electrode.

9. A display device comprising:
   a data line disposed on a substrate;
   a first pigment layer formed to cover the data line;
   a second pigment layer disposed by a side of the first pigment layer and formed to have a first region which corresponds to an overlap region of the first and second pigment layers; and
   a first pixel electrode and a second pixel electrode arranged in second regions in which the first and second pigment layers do not overlap with each other, the first pixel electrode is separate from the second pixel electrode,
   wherein the overlap region is configured to block light and includes overlapping the first pigment layer, the second pigment layer, and the data line in the first region between the first pixel electrode and the second pixel electrode.

10. The display device of claim 9, wherein the first and second pigment layers overlap in the first region between a first common electrode and a second common electrode, and wherein the data line is disposed in the first region.

11. The display device of claim 9, wherein the first pixel electrode and the second pixel electrode are arranged to be on both sides of the data line.

12. The display device of claim 11, wherein at least one of the first pixel electrode and the second pixel electrode expands up to the first region.

13. The display device of claim 12, wherein only one of the first pixel electrode and the second pixel electrode arranged to be on one of both sides of the data line expands up to the first region.

14. The display device of claim 12, wherein a portion of the first pixel electrode and a portion of the second pixel electrode are located in the first region.

15. The display device of claim 12, wherein edges of the first common electrode and the second common electrode and edges of the data line are disposed at same perpendicular lines projected from the first common electrode and the second common electrode to the data line, respectively.

16. The display device of claim 9, further comprising:
drain electrodes of thin film transistors arranged on a same plane as the data line and separated from each other,
wherein the first pixel electrode and the second pixel electrode overlap with a part of corresponding drain electrodes.

17. The display device of claim 9, further comprising:
an insulation layer interposed between the first and second pigment layers and the first pixel electrode and the second pixel electrode.

\* \* \* \* \*